(12) United States Patent
Resnick et al.

(10) Patent No.: US 9,452,574 B2
(45) Date of Patent: Sep. 27, 2016

(54) FABRICATION OF SEAMLESS LARGE AREA MASTER TEMPLATES FOR IMPRINT LITHOGRAPHY USING STEP AND REPEAT TOOLS

(71) Applicant: Molecular Imprints, Inc., Austin, TX (US)

(72) Inventors: Douglas J. Resnick, Leander, TX (US); Michael N. Miller, Austin, TX (US); Frank Y. Xu, Round Rock, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 512 days.

(21) Appl. No.: 13/720,315

(22) Filed: Dec. 19, 2012

(65) Prior Publication Data

US 2013/0153534 A1    Jun. 20, 2013

Related U.S. Application Data

(60) Provisional application No. 61/577,135, filed on Dec. 19, 2011.

(51) Int. Cl.
| | | |
|---|---|---|
| *B29D 11/00* | (2006.01) | |
| *B82Y 10/00* | (2011.01) | |
| *B82Y 40/00* | (2011.01) | |
| *B82Y 30/00* | (2011.01) | |
| *G03F 7/00* | (2006.01) | |
| *B29C 59/02* | (2006.01) | |
| *B29C 43/02* | (2006.01) | |
| *B29C 43/00* | (2006.01) | |
| *B29C 33/38* | (2006.01) | |
| *B29C 33/42* | (2006.01) | |

(52) U.S. Cl.
CPC ....... *B29D 11/0074* (2013.01); *B29C 33/3842* (2013.01); *B29C 43/003* (2013.01); *B29C 43/021* (2013.01); *B29C 59/022* (2013.01); *B29C 2033/426* (2013.01); *B29C 2043/025* (2013.01); *B29C 2059/023* (2013.01); *B29D 11/00* (2013.01); *B29D 11/00769* (2013.01); *B82Y 10/00* (2013.01); *B82Y 30/00* (2013.01); *B82Y 40/00* (2013.01); *G03F 7/0002* (2013.01); *G03F 7/0017* (2013.01); *Y10S 977/887* (2013.01); *Y10S 977/888* (2013.01)

(58) Field of Classification Search
None
See application file for complete search history.

(56) References Cited

U.S. PATENT DOCUMENTS

| | | | |
|---|---|---|---|
| 5,437,946 A | | 8/1995 | McCoy |
| 6,033,811 A | * | 3/2000 | Lee .................. 430/5 |
| 6,225,013 B1 | | 5/2001 | Cohen et al. |
| 6,387,787 B1 | | 5/2002 | Mancini et al. |
| 6,873,087 B1 | | 3/2005 | Choi et al. |
| 6,932,934 B2 | | 8/2005 | Choi et al. |
| 6,936,194 B2 | | 8/2005 | Watts |
| 7,077,992 B2 | * | 7/2006 | Sreenivasan et al. ........ 264/496 |

(Continued)

FOREIGN PATENT DOCUMENTS

| | | |
|---|---|---|
| KR | 10-2006-0080010 | 7/2006 |
| KR | 10-2008-0073824 | 8/2008 |

(Continued)

*Primary Examiner* — Jeffrey Wollschlager
(74) *Attorney, Agent, or Firm* — Cameron A. King

(57) ABSTRACT

Described are methods of forming large area templates useful for patterning large area optical devices including e.g. wire grid polarizers (WGPs). Such methods provide for seamless patterning of such large area devices.

7 Claims, 10 Drawing Sheets

(56) References Cited

U.S. PATENT DOCUMENTS

| | | |
|---|---|---|
| 7,157,036 B2 | 1/2007 | Choi et al. |
| 7,179,396 B2 | 2/2007 | Sreenivasan |
| 7,396,475 B2 | 7/2008 | Sreenivasan |
| 8,076,386 B2 | 12/2011 | Xu et al. |
| 8,349,241 B2 | 1/2013 | Sreenivasan et al. |
| 2004/0065252 A1 | 4/2004 | Sreenivasan et al. |
| 2004/0121246 A1* | 6/2004 | Brown .............................. 430/5 |
| 2005/0076322 A1* | 4/2005 | Ye et al. ........................ 716/20 |
| 2007/0023692 A1 | 2/2007 | Stenger |
| 2008/0100779 A1* | 5/2008 | Choo .................. G02B 5/3058 349/96 |
| 2008/0100914 A1* | 5/2008 | Suganuma ........... G02B 5/3025 359/485.03 |
| 2008/0145568 A1* | 6/2008 | Lee et al. ..................... 427/595 |
| 2008/0299467 A1* | 12/2008 | Kim et al. ........................ 430/5 |
| 2009/0079005 A1* | 3/2009 | Haffner et al. .............. 257/368 |
| 2009/0127238 A1* | 5/2009 | Corrigan ............ B23K 26/0823 219/121.68 |
| 2009/0224436 A1* | 9/2009 | Mikami et al. ................ 264/447 |
| 2009/0246706 A1* | 10/2009 | Hendel et al. ................ 430/314 |
| 2009/0269705 A1* | 10/2009 | Kobrin .......................... 430/322 |
| 2009/0273124 A1 | 11/2009 | Okinaka et al. |
| 2010/0123885 A1* | 5/2010 | Kobrin ............................ 355/53 |
| 2010/0173113 A1* | 7/2010 | Ermochkine et al. .......... 428/58 |
| 2011/0027408 A1* | 2/2011 | Suzuki et al. ................ 425/471 |
| 2011/0042352 A1 | 2/2011 | Okushima et al. |
| 2013/0224636 A1* | 8/2013 | Kobrin .............................. 430/5 |

FOREIGN PATENT DOCUMENTS

| | | |
|---|---|---|
| KR | 10-2010-0109374 | 10/2010 |
| WO | WO2009093700 * | 7/2009 |
| WO | WO 2011-107302 | 9/2011 |

* cited by examiner

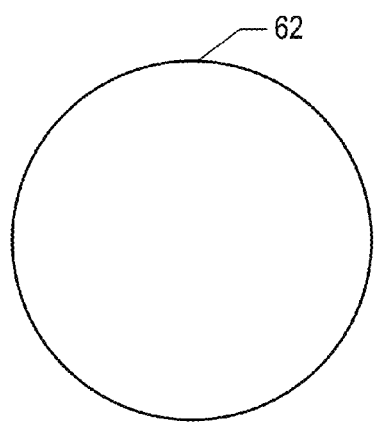
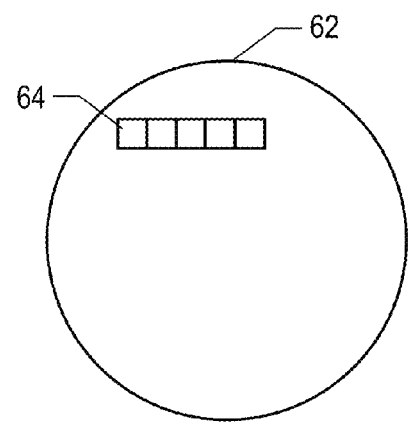
*FIG. 3A*  *FIG. 3B*
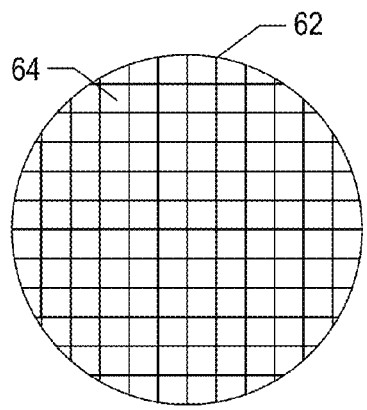
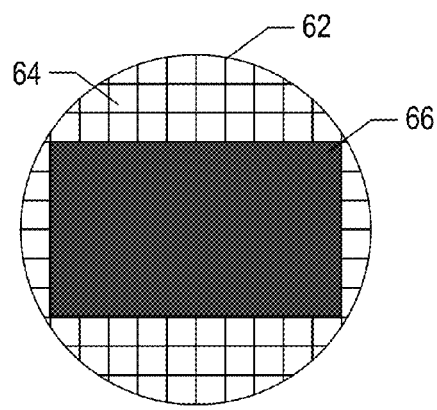
*FIG. 3C*  *FIG. 3D*

FABRICATION OF SEAMLESS LARGE AREA MASTER TEMPLATES FOR IMPRINT LITHOGRAPHY USING STEP AND REPEAT TOOLS

CROSS-REFERENCE TO RELATED APPLICATION

This application claims priority to U.S. application Ser. No. 61/577,135 filed Dec. 19, 2011, which is incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

FIGS. 3A-3D illustrate an exemplary method of printing a large area seamless pattern on a substrate.

DETAILED DESCRIPTION

Figure 1:
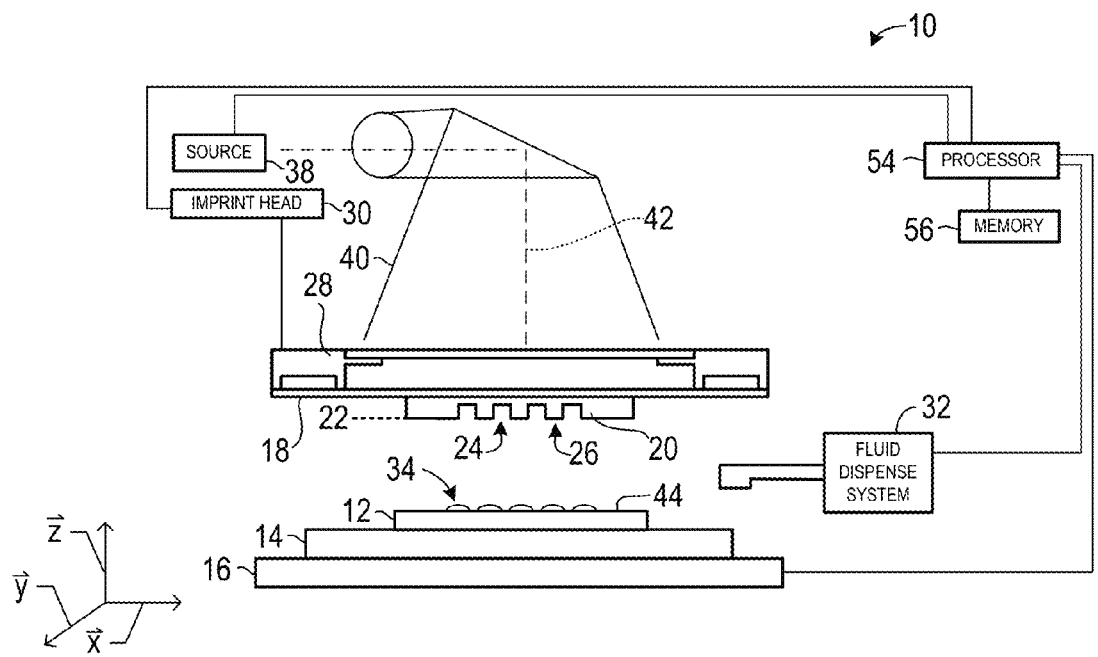
FIG. 1 illustrates a simplified side view of a lithographic system having a template and a mold spaced apart from a substrate.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
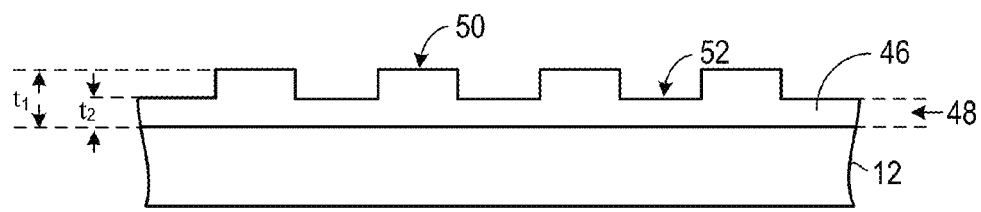
FIG. 2 illustrates a simplified view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference in their entirety.

Among other applications, imprint lithography processes and systems can be used advantageously in the fabrication of optical devices such as wire grid polarizers (WGPs). Wire grid polarizers can be used in a variety of devices, including optical devices, used in various industries and markets. One example is incorporating the WGP into a liquid crystal display (LCD) flat panel module. These flat panel modules may be applied to fabricate the display screen for devices such as mobile devices (such as phones, tablets and notebooks), computer monitors, TVs and the like.

Until now, WGPs have been restricted to small markets, such as projectors. The reason is the difficulty in scaling the WGP to very large areas, as well as high manufacturing cost.

By creating a large master template using methods provided herein, and then using further technologies, such as e.g. imprint lithography described herein, it becomes possible to insert WGP technology into more mainstream large area display applications. The combination of the master mask and imprint lithography enables a cost effective solution that improves the performance of the display and lowers the power consumption of the display, thereby extending battery lifetime.

It should be understood, however, that as has been previously noted, the present invention is not limited to WGPs. Other large area patterns can be created with the approach described and which can be useful in the formation of master templates. For example, large area dot arrays, hole arrays and the like can enable plasmonic behavior which is useful for solar devices, wavelength shifting and so on.

Previous efforts at making large area WGPs have been partially successful, but have lead to undesirable disruptions or seams at the interface of adjacent fields. With a stepper or scanner, it is possible to define a master mask with the proper resolution of gratings, and then use a step and repeat approach to create a replica or working template having a much larger area. That is, the master small field pattern is printed many times to create a larger area, repeating pattern. However, disruptions can occur when two fields are placed adjacent to each other. Commercially suitable large area WGPs require that the polarizer have no discernable visible defects to the viewer. In a large area display application, the eye can be sensitive to disruptions in patterns less than a micron. For example, a WGP which was formed by repeating a 25 mm×25 mm pattern with a 2×2 array of fields. Although the device performs well within the 25 mm×25 mm field, the fields do not butt together seamlessly with the fields are separated by 10's of microns. The disruption issue exists, however for butting errors down to about 1 um.

Several applications using imprint lithography require patterns with small dimensions (less than 200 nm) that must cover large areas (~>30 mm×30 mm). For smaller fields (areas), an e-beam writing system may be acceptable for patterning small features. For larger areas, the write time of an e-beam system is prohibitively slow. Other lithography systems, such as contact/proximity aligners, holographic projectors are large panel steppers and scanners can cover much larger areas but do not have the required resolution.

Fabricating such large area WGPs by imprint lithography processes requires the fabrication of a corresponding dimensioned master template. These types of master templates are useful for imprinting not just large area WGPs but also other large area optical devices that essentially rely on the creation of an averaging device whose performance must be constant across the entire large area. Provided herein are methods for creating large area imprint templates on wafer substrates with patterns that appear to be "seamless" between the fields. Such methods include the use of steppers or scanners and/or imprint lithography processes and tools. In certain embodiments, optical proximity effect strategies and field offsetting strategies be employed to ensure that adjacent fields print "seamlessly." Using the methods provided herein, large area patterns can be created with either little or no seam between stepping fields. Such patterns can be created by taking advantage of the stage accuracy of high-end optical steppers and scanners to place the fields within ~10 nm or less of the ideal placement together with the methods provided herein. Today's high-end optical reduction stepper and scanner tools, such as a 193 nm immersion scanner, can resolve features as small as 40 nm and have stage precision less than 10 nm. By also taking account any pattern magnification issues, and together with the methods provided herein, it is possible to create a near-seamless large area pattern on a 300 mm wafer.

Turning to FIGS. 3A-3D, depicted therein are steps according to an embodiment of the invention to form a seamless pattern over a large area on a 300 mm wafer. FIG. 3A depicts an unpatterned wafer 62. FIG. 3B depicts the start of printing individual stepper or scanner fields 64 on wafer 62. FIG. 3C depicts wafer 62 fully populated with fields 64. FIG. 3D depicts the largest 16:9 ratio large area pattern 166 that can be made with 300 mm wafer (approximately 11.6"). It will be appreciated that with eventual transition to 450 mm wafers, even larger area patterns (and resultant masks or templates) can be defined by such a process.

Figure 4:
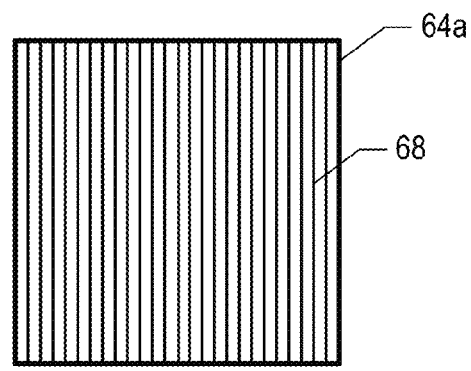
FIG. 4 illustrates a patterned field useful for forming a large area seamless pattern according to an embodiment of the invention.
Figure 5:
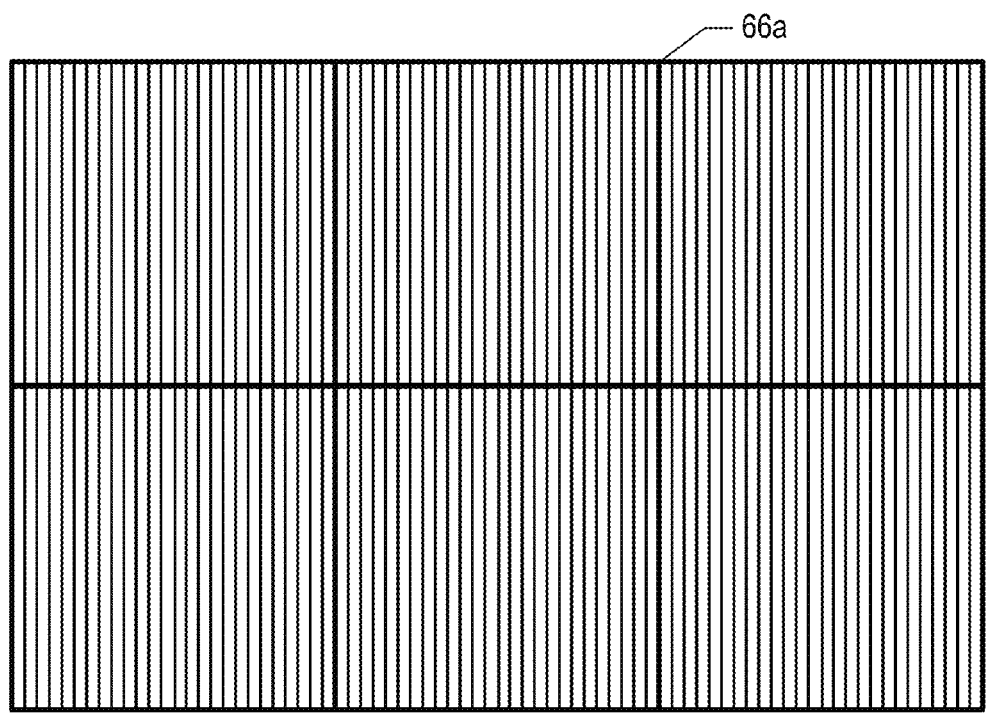
FIG. 5 illustrates a large area seamless pattern formed from the patterned fields of FIG. 4.

In an exemplary application, in order to form a wire grid polarizer (WGP), the stepper or scanner field 64a can consist of a series of parallel lines 68, as shown in FIG. 4, which can produce linear grating patterns. The patterned fields can be "stitched" together seamlessly, as further described herein, to create larger area grating 66a. It will be understood that although the smallest half pitch features that can currently be made today on a 193 nm scanner are approximately 40 nm, this does not define the limit of patterned features formed according to the methods herein. For example, spacer double patterning, a technique that involves a set of deposition and etch back steps, can be used to halve the pitch to 20 nm. Even smaller dimensions can be obtained by triple or quadruple spacer patterning. For a WGP, a half pitch of 50 nm can provide for sufficient performance.

It should further be understood that methods described herein are not limited to patterns of lines and spaces. For example, scanners can also be used to create dot or hole patterns. In addition, for patterns requiring organized line segments with varying lengths and widths, the same processes can be applied. As one example, if a large area array of rectangles was required with dimensions of ~20 nm×50 nm, spacer double patterning can be used to create 20 nm half pitch lines and spaces into a hard mask. 50 nm lines could then be patterned orthogonal to the 20 nm lines. Once etched into the hard mask, a series of 20 nm×50 nm line segments would then be formed.

Figure 6A:
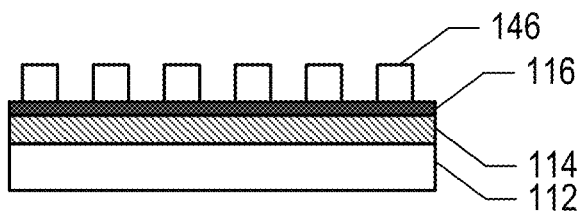
FIGS. 6A-6D illustrate an exemplary method for forming a master template according to an embodiment of the invention.
Figure 6B:
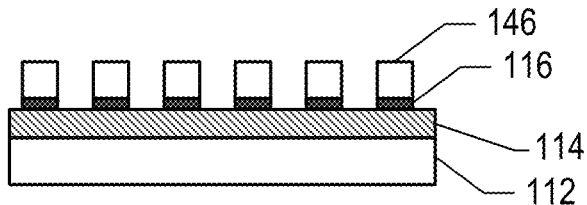
Figure 6C:
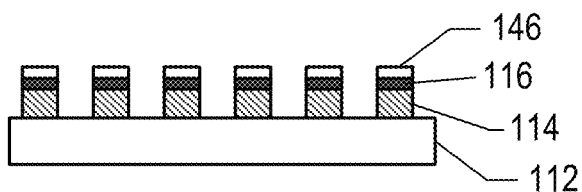
Figure 6D:
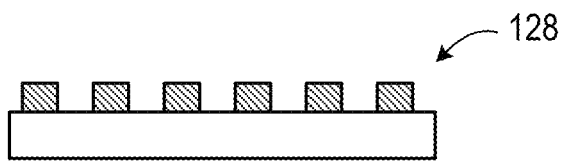

While the above has generally addressed large area patterning, to create a master mask (or template) on e.g. a wafer, additional processing steps are required. FIGS. 6A-6D show one such example. As shown, silicon dioxide film 114 is deposited on silicon wafer or substrate 112 using any number of techniques (thermal oxidation, CVD, PECVD, sputtering). Resist pattern 146 can be formed on oxide layer 114, or alternatively as shown in FIG. 6A, antireflective (AR) coating or film 116 is first formed on oxide layer 114 prior to forming resist pattern 146 on AR film 116, such that AR film 116 is between the resist and oxide. To make the master template, resist pattern 146 is first transferred into AR film 116 (as shown in FIG. 6B), and then into oxide layer 114 (as shown in FIG. 6C), stopping on silicon substrate 112. Any remaining resist (and remaining AR film if present) would then be stripped away to form the final patterned mask or template 128 (FIG. 6D).

There are several ways in which the fields can be stitched together to create a seamless or near-seamless pattern. It is possible, for example, to use the aperture blades of a scanner or stepper to set the field size. Light flair from the blades may cause variations in exposure dose at the pattern edges. One way to correct for this is to reduce the exposure dose of the features at the very edge of the pattern.

Figure 7:
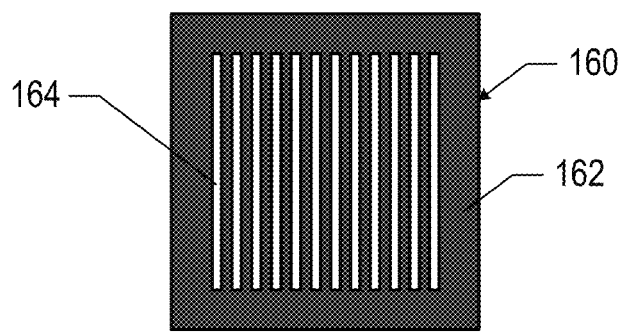
FIG. 7 illustrates an exemplary dark field mask useful for printing large area seamless patterns.

A second way to stitch the patterns is to use a dark field mask, such as mask 160 depicted in FIG. 7. Mask 160 has opaque material 162, such as chrome, deposited everywhere with the exception of the area in which lines 164 are defined. The opaque material (e.g., chrome) located outside the pattern area prevent any stray light from landing on adjacent fields during the lithography step of the subject field.

Wire grid polarizers can be applied to a variety markets, including flat panel displays and smart windows. These technologies require large area polarizers with no visible defects. The most likely method for fabricating the master templates needed to imprint the polarizers incorporates a "step and repeat" strategy in which a smaller field polarizer is printed many times to create a larger area polarizer. In this invention, we employ optical proximity effect strategies and field offsetting strategies in order to insure that adjacent fields print "seamlessly".

Figure 8:
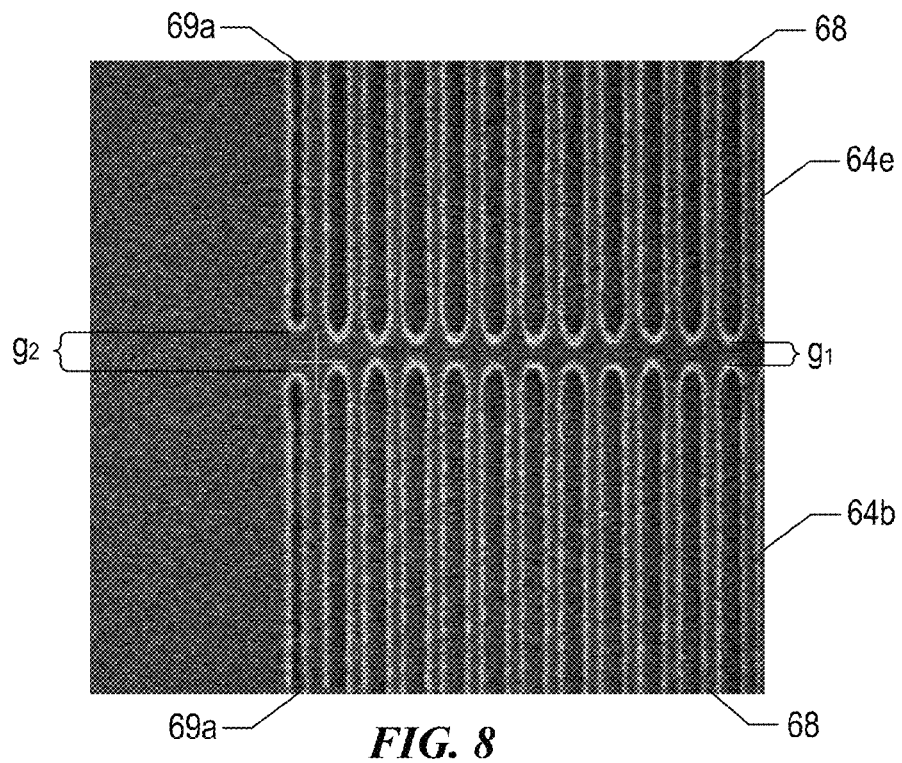
FIG. 8 illustrates an example of adjacent field abutment for large area patterning.

While current high-end scanner and stepper tools are capable of placing adjacent fields to an accuracy of better than 10 nm, the printing of the features at the edges of the field, in both the x and y directions, can be impacted (especially for feature sizes under 300 nm) by optical effects which are a result of the physics of the exposure systems. FIG. 8 shows the results of an attempt to butt adjacent fields 64b and 64c having printed grating lines 68 having dimensions of approximately 65 nm. In FIG. 8, despite the fact that fields 64b and 64c have been correctly located, the printed lines 68 do not join in the y-direction, with gap $g_1$ between them. The shortening of the lines at small dimensions is typically referred to as line end shortening. FIG. 8 also illustrates optical effects problems in the x-direction. As can be seen, the resulting aerial images of end lines 69a are different from internal lines 68 of the grating. Specifically, end lines 69a have an even greater line end shorting effect, shorter than internal lines 68, with an even larger gap $g_2$ between them. Further, lines 69a are narrower than internal lines 68. Other optical effects can result in the feature appearing either undersized or not completely resolved.

The optical effects described above can be overcome through applying optical proximity corrections (OPC) to correct the sizing of the printed features at the border of the field. Optical proximity correction (OPC) refers lithography enhancement techniques known in the art that are commonly used to compensate for image errors due to optical effects, e.g. diffraction, as well as process effects. In particular, with respect to irregularities such as line width narrowing and/or or line end shorting, such irregularities are particularly amenable to compensation by changing the pattern on the mask used for imaging. OPC can correct these errors by e.g. moving edges to the line pattern written on the mask. This may be driven by pre-computed look-up tables based on width and spacing between line features (known as rule based OPC) or by using compact models to dynamically simulate the final pattern and thereby drive the movement of edges, typically broken into sections, to find the best solution (model based OPC). At present, OPC techniques are mainly used for semiconductor devices, but such techniques have not been deployed in situations requiring features printed at high fidelity all the way to the very edge of the field.

OPC as used herein will generally be used in the context of describing feature corrections that need to be applied to a 4× reduction mask in order to correct for the imperfect aerial image that is transferred from a 4× reduction mask to the imaging resist on a mask, template or wafer. For example, in an aspect of the invention, OPC is used to deliberately lengthen the lines (e.g., in a range of 5 to 200 nm) of the mask beyond the desired print length in order to cause the printed lines from adjacent fields to either "meet"

or even overlap. As noted, in the case of a WGP, the features must be printed out to the very edge of the field, and application of OPC techniques creates a more accurate way to correct feature sizes at the border. For example, in such manner individual lines near the edge of a border can be corrected to ensure that the printing yields continuous seamless lines across multiple fields.

Figure 9:
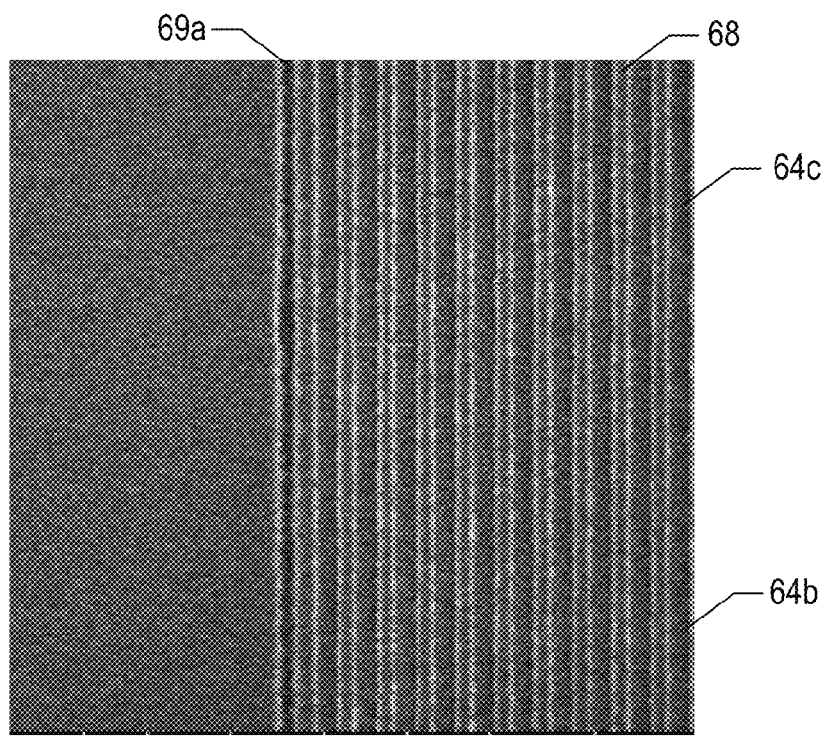
FIG. 9 illustrates another example of adjacent field abutment for large area patterning.
Figure 10:
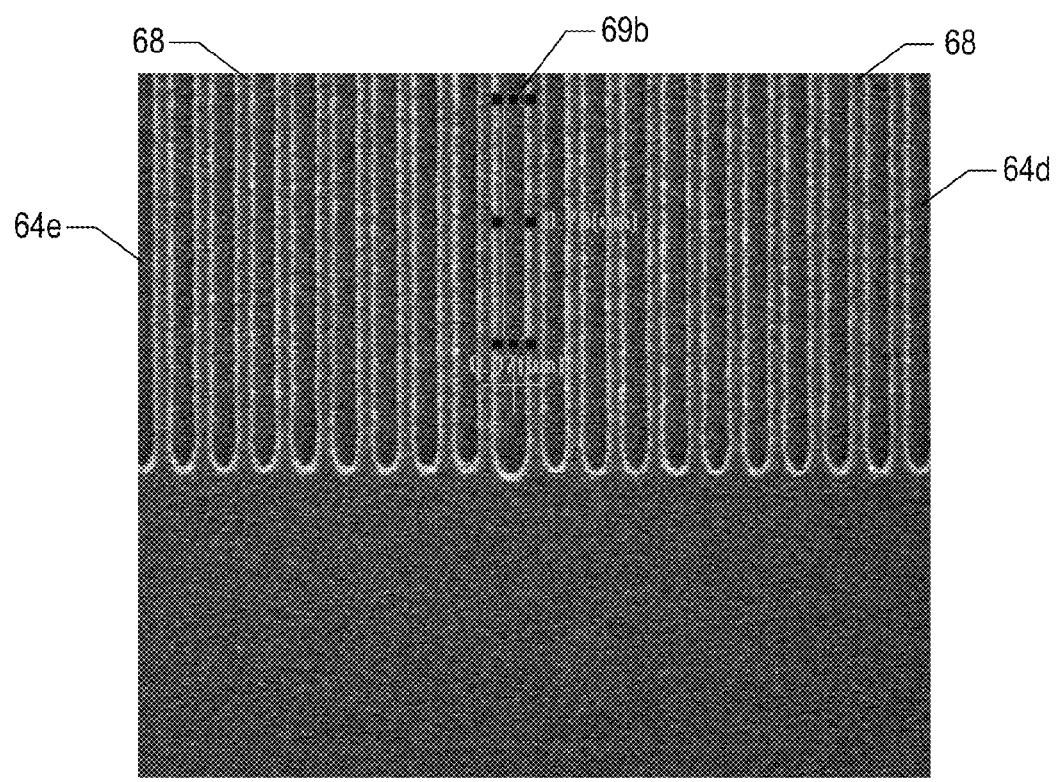
FIG. 10 illustrates yet another example of adjacent field abutment for large area patterning.

In another aspect of the invention, the scanner or stepper can be programmed to deliberately offset the placement of the fields, to in essence force the printed fields to overlap. FIG. 9 shows an example in which fields 64b and 64c are deliberately offset in the y direction by about 80 nm. As can be seen, gaps $g_1/g_2$ have been eliminated, producing continuous grating lines 68 and 69a, and such that the field butting in the y direction is no longer noticeable. Such an offset approach however still has not corrected for the optical effect producing narrower end line. To further correct for the narrower end line, the fields can be overlapped in the x direction as well. This is depicted in FIG. 10. The correction shown here employed a 50 nm shift in the x direction, producing an x overlap between fields 64d and 64e. This causes prior narrower end lines 69a to overlap, yielding line 69b. While the depicted line 69b is slightly oversized relative to lines 68, the resultant width can be further tuned either by shifting the overlap and/or using OPC techniques to change the size of the end feature in the x direction so that the line does print correctly. As will be appreciated, a combination of OPC techniques and field offsetting can be used to achieve continuous, seamless gratings of the desired feature width.

Figure 11A:
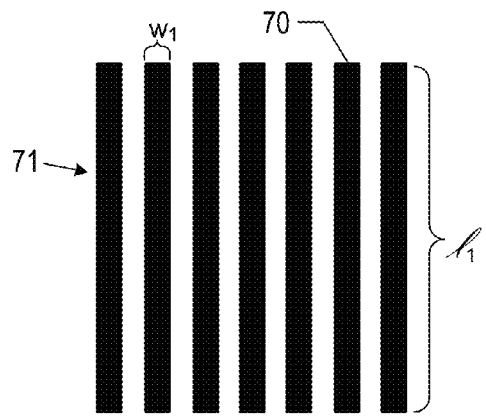
FIGS. 11A-11D illustrate exemplary methods for forming a master template according to an embodiment of the invention and the resulting printed pattern.
Figure 11B:
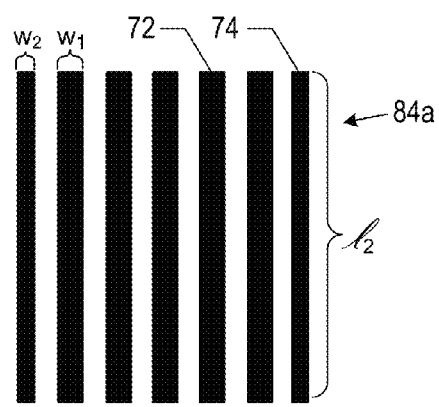

FIGS. 11A-11D and 12A-12B depict schematic Illustrations of the above described OPC and/or offset corrections. FIG. 11A depicts mask 71 having lines 70 of equal dimensions length $l_1$ by width $w_1$. Due to optical effects discussed, mask 71 prints field 84a with line end shortening and line narrowing, as is depicted in FIG. 11B.

Figure 11C:
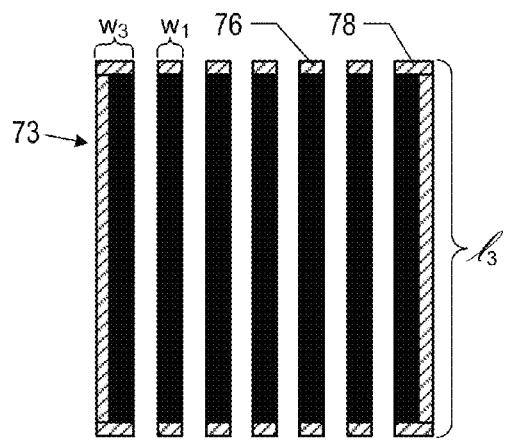
Figure 11D:
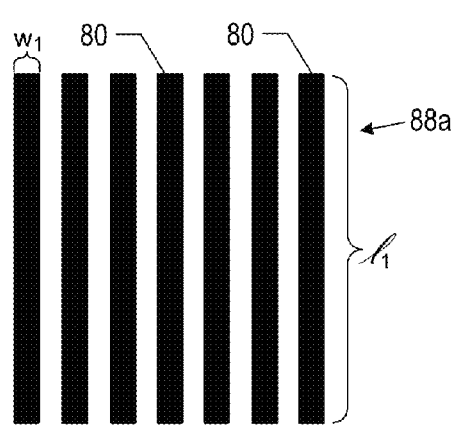
Figure 12A:
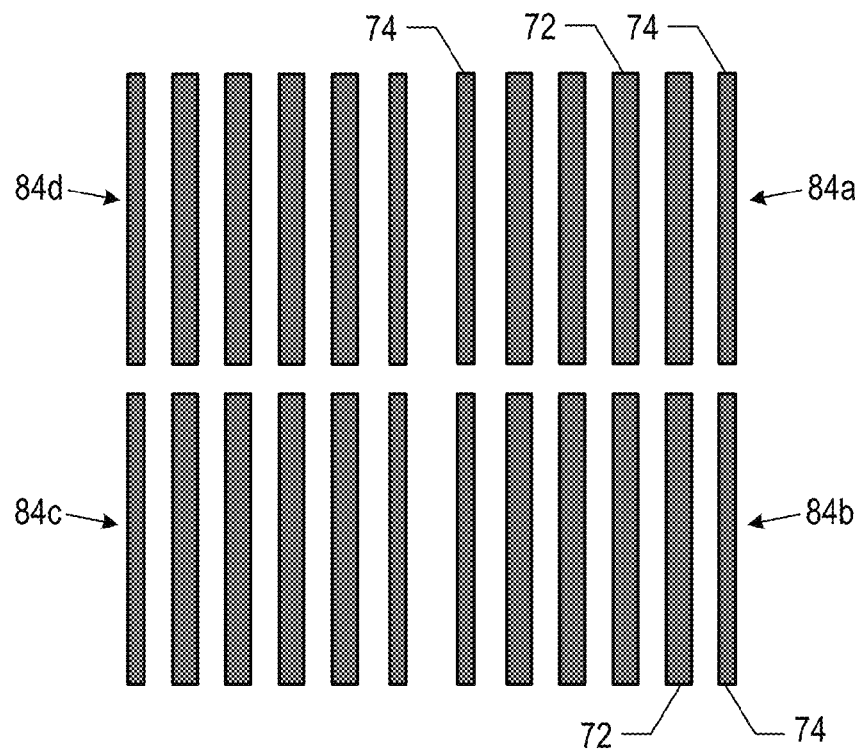
FIGS. 12A-12B illustrate a further example of adjacent field abutment for large area patterning.
Figure 12B:
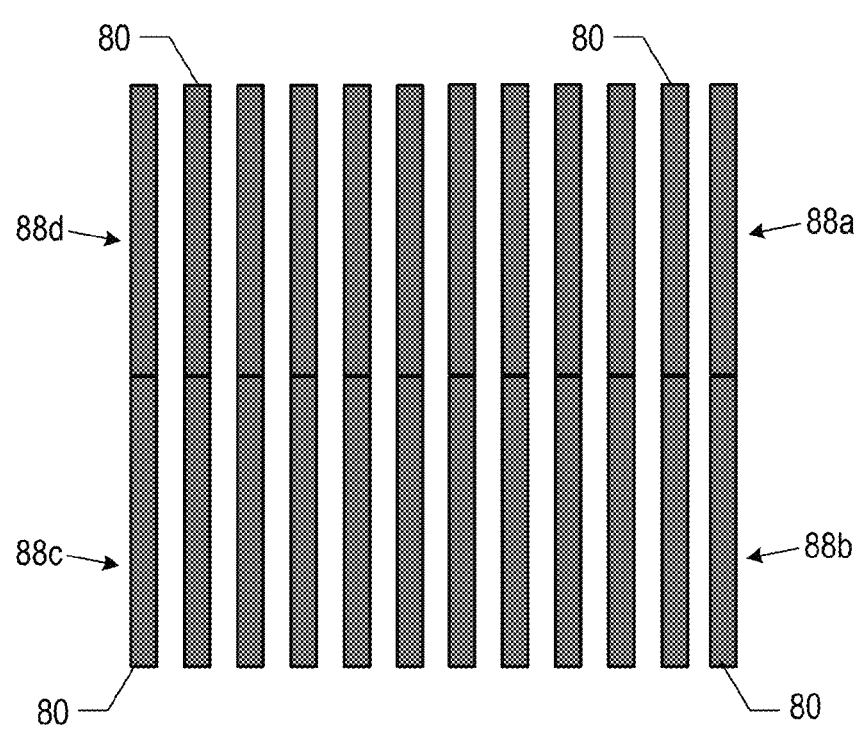

Specifically, internal lines 72 and end lines 74 are all shortened to length $l_2$, with end lines 74 further narrowed to width $w_2$. FIG. 11C depicts mask 73, which has internal lines 76 of same width $w_1$ but which have been lengthened to length $l_3$ and with end lines 78 both lengthened to length $l_3$ and further widened to width $w_3$. Mask 73 prints field 88a in which all lines 80 are of the same desired length $l_1$ and width $w_1$. FIG. 12A shows the result of printing abutted fields 84a-84d with mask 71, yielding undesirable gaps between fields due to line shortening effects and narrower end line 74 widths as compared to internal line 72 widths. FIG. 12B, by contrast, shows the result of printing abutted fields 84a-84d with mask 73, yielding desired seamless patterning of lines 80, each having the desired length and width. Note that the result of FIG. 12B can also be achieved through overlap printing using mask 71 with the necessary x and y offsets. In addition a combination of OPC and overlapping can likewise achieve the result of FIG. 12B.

Figure 13A:
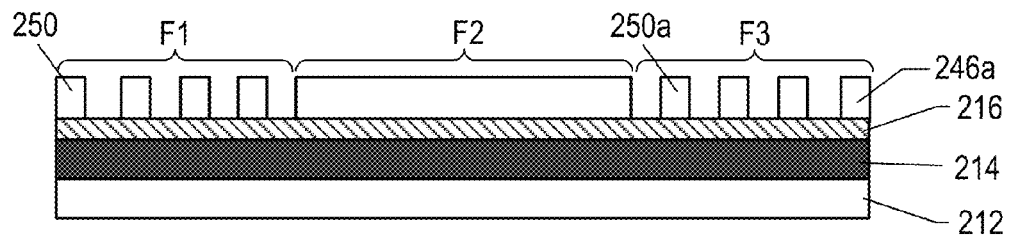
FIGS. 13A-13E illustrate another exemplary method for forming a master template according to an embodiment of the invention.
Figure 13B:
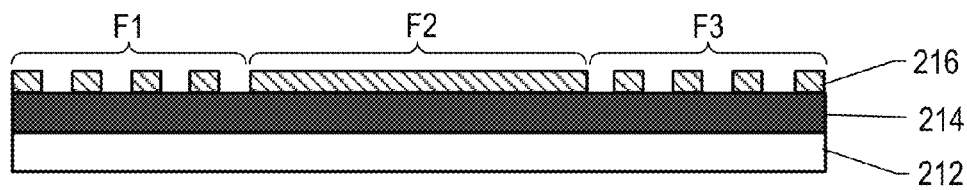
Figure 13C:
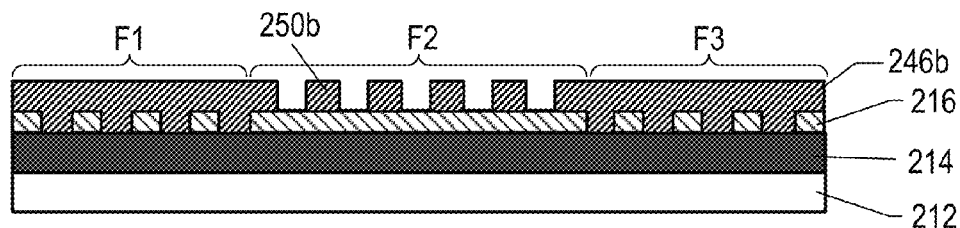
Figure 13D:
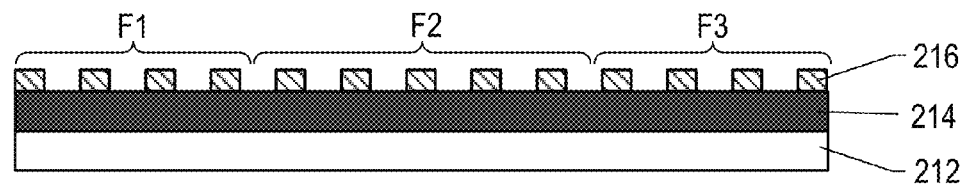
Figure 13E:
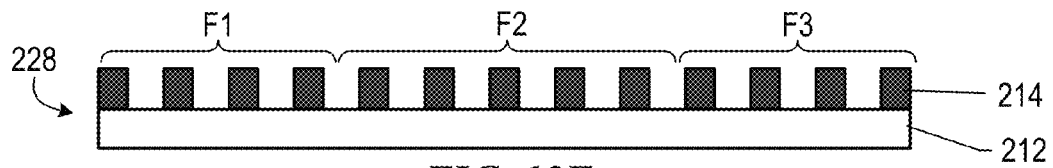

It should also be noted that the optical effect problems described above become worse as feature size decreases. In the examples shown in FIGS. 8-10, 65 nm feature lines were printed. As noted, 65 nm is fairly easy to resolve in an immersion based 193 nm scanner. However, wire grid polarizers perform best at shorter wavelengths. WGPs with 50 nm line widths seems to be a better line size to use and 40 nm is even possible with a high end immersion scanner. However at 40 nm, the process latitude of the printing process is quite small and any imperfection in the aerial image will cause more serious printing problems for the abutted grating fields, thus further lending itself to the above described approaches. Another way to seamlessly "stitch" together a large area pattern is to perform imprint lithography in which multiple lithography steps are performed such a portion of the entire array is exposed in a manner such that no adjacent field edges are concurrently exposed in any one lithography step. An example of such a process is shown in FIGS. 13A-13E. As shown in FIG. 13A, substrate 212 is provided with oxide layer 214 and hard mask layer 216. Resist patterned layer 146a is formed on hard mask 216. As shown, resist pattern layer 146a includes patterned features 250a in pattern fields $F_1$ and $F_3$, whereas field $F_2$ remains unpatterned. After an exposure, the $F_1$ and $F_3$ patterns are etched into hard mask 216 (e.g., Cr, poly, nitride, carbon, other metals) and remaining resist 146a is stripped away (FIG. 13B). Patterned layer 146b is then formed over the hard mask 216, such that layer 146b includes patterned features 250b in pattern field $F_2$ whereas fields $F_1$ and $F_3$ remain patterned (FIG. 13C). Again after exposure, the $F_2$ pattern is etched into hard mask 216 and remaining resist stripped away (FIG. 13D). The process can be further repeated until all fields are populated (i.e. patterned into hard mask 216). The pattern is then etched into oxide layer 214 to create large area patterned mask 228. If alignment is required for this "Litho/Etch-Litho/Etch" (or LELE) approach, a zero level set of align marks can be first applied to the wafer. For example, such alignment marks can be placed outside the active area. As another example, they can first be placed in each field and then etched into the wafer. A planarization step is then be employed, so that any topography is removed, thereby eliminating any unwanted pattern from the alignment mark.

Figure 14A:
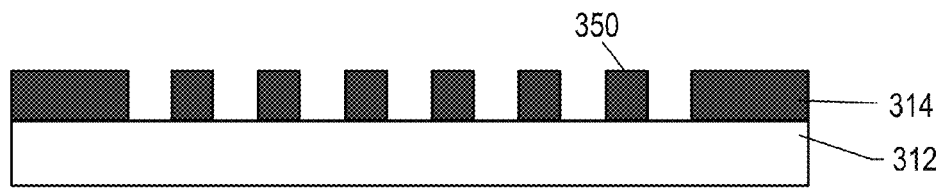
FIGS. 14A-14E illustrate yet another exemplary method for forming a master template according to an embodiment of the invention.
Figure 14B:
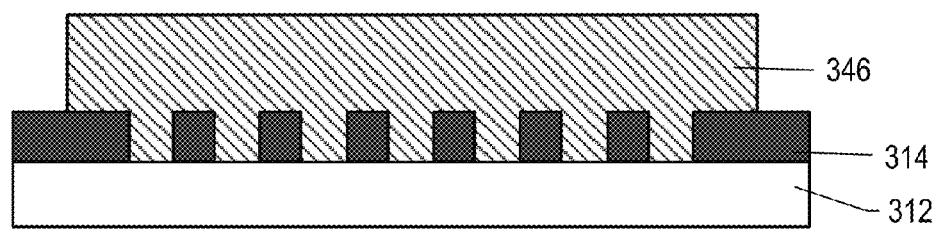
Figure 14C:
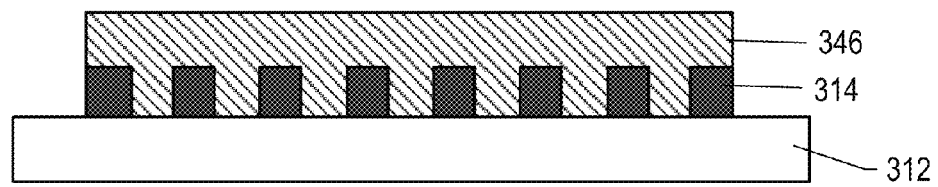
Figure 14D:
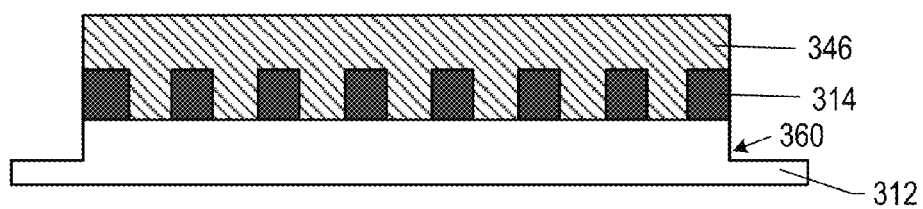
Figure 14E:
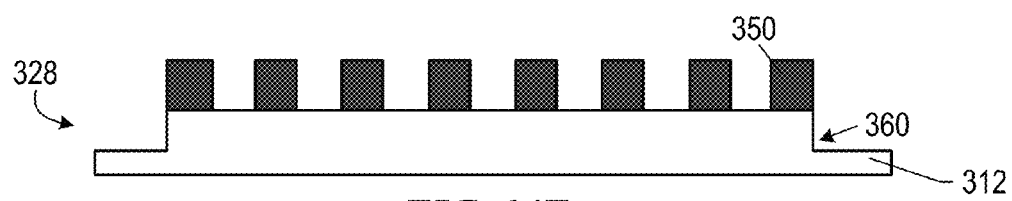

It may be desirable that the master mask formed according to the methods provided herein have a mesa, such that the pattern resides on a raised portion of the silicon. Such a mesa can be formed, for example, according to the method shown in FIGS. 14A-14E. FIG. 14A depicts silicon substrate 312 and oxide layer 314 with patterned features 350 formed in oxide layer 314. A further lithography step is formed in which pattern features 350 are protected by application of resist layer 346, and optionally a hard mask layer, such as an oxide (not shown), such that oxide layer 314 is exposed outside of the pattern feature area (FIG. 14B). An oxide etch is performed to selectively etch away the area outside of the pattern (FIG. 14C), followed by a silicon etch, thereby forming mesa 360 on substrate 312 (FIG. 14D). Remaining resist 346 is then stripped away to provide template 328 with pattern features extending from mesa 360. Many chemistries can be used to etch the oxide and silicon. For the oxide, examples include $CF_4$ and $CHF_3$. For the silicon, chlorine and hydrogen bromide may be used.

It will be understood that the fabrication of large area master masks or templates using processes described herein is not limited to the particular use of 193 nm immersion tools. For example, extreme ultraviolet lithography (EUV) tools or nano-imprint lithography (NIL) tools can be used. In addition, other approaches such as Scanning Beam Interference Lithography (SBIL), multiple electron beam lithography and stencil based scanning e-beam lithography can be applied in fabricating large area master or working templates according to the methods described herein.

Once the large area master mask is created, further methods are available to form sub-master or replica (or working) templates using imprint lithography. For example, the silicon wafer pattern can be transferred to a glass substrate. Similarly, the silicon wafer pattern can be transferred to a flexible film. The pattern on the flexible film becomes a replica template that can then be used in either a roll-to-roll or roll-to-plate system.

Finally, such transfer processes can further incorporate multiple step-and-repeat imprints to populate very large area replica masks. This may be required for display applications where panels now have dimensions of greater than 3 m×3 m.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A method of forming an imprint lithography template comprising:
    providing a substrate;
    forming a patterned layer comprising gratings of a desired length and width on the substrate by creating a plurality of patterned fields on the substrate, wherein the creating the plurality of patterned fields further comprises the steps of using an optical scanner with field placement accuracy of 10 nm or less and a dark mask to create each field by an optical lithography step, wherein the dark mask further includes one or more gratings having a length and width greater than the desired length and width to compensate for optical effects and wherein one or more of the plurality of patterned fields are offset in the x and/or y direction to compensate for optical effects, such that any seams at the interface of adjacent field patterns are less than 10 microns;
    transferring the pattern into the substrate and removing any remaining patterned layer to form a patterned feature area on the substrate.

2. The method of claim 1 wherein the optical scanner is a 193 nm immersion scanner.

3. The method of claim 1 wherein the substrate further comprises an oxide layer and wherein the pattern is first transferred into the oxide layer prior to transferring the pattern into the substrate.

4. The method of claim 3 wherein the substrate further comprises an anti-reflective coating layer on the oxide layer.

5. The method of claim 3 wherein the substrate further comprises a hard mask on the oxide layer.

6. The method of claim 1 further comprising the step of providing a mesa on the substrate with the patterned feature area located on the mesa.

7. The method of claim 6 further comprising the step of forming a protective layer over the patterned feature area, and etching away a portion of the substrate to form the mesa.

* * * * *